(12) United States Patent
Sandhu et al.

(10) Patent No.: US 7,723,009 B2
(45) Date of Patent: May 25, 2010

(54) TOPOGRAPHY BASED PATTERNING

(75) Inventors: Gurtej S. Sandhu, Boise, ID (US);
Steve Kramer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 972 days.

(21) Appl. No.: 11/445,907

(22) Filed: Jun. 2, 2006

(65) Prior Publication Data

US 2007/0281220 A1 Dec. 6, 2007

(51) Int. Cl.
*G03F 7/00* (2006.01)
*G03F 7/004* (2006.01)

(52) U.S. Cl. .................... 430/270.1; 430/311; 430/312; 430/313; 430/317; 430/322; 430/331; 430/273.1

(58) Field of Classification Search ................. 430/311, 430/312, 270.1, 273.1, 313, 317, 322, 331
See application file for complete search history.

(56) References Cited

U.S. PATENT DOCUMENTS

| | | | |
|---|---|---|---|
| 5,328,810 A | 7/1994 | Lowrey et al. | |
| 5,772,905 A | 6/1998 | Chou | |
| 5,948,470 A | 9/1999 | Harrison et al. | |
| 6,319,853 B1 | 11/2001 | Ishibashi et al. | |
| 6,667,237 B1 | 12/2003 | Metzler | |
| 6,911,400 B2 | 6/2005 | Colburn et al. | |
| 6,926,953 B2 | 8/2005 | Nealey et al. | |
| 7,115,525 B2 | 10/2006 | Abatchev et al. | |
| 7,208,379 B2 | 4/2007 | Venugopal et al. | |
| 2003/0170995 A1 | 9/2003 | Chou | |
| 2004/0175628 A1* | 9/2004 | Nealey et al. .................. 430/1 |
| 2005/0112886 A1 | 5/2005 | Asakawa et al. | |
| 2006/0046484 A1 | 3/2006 | Abatchev et al. | |
| 2006/0216923 A1 | 9/2006 | Tran et al. | |
| 2006/0281266 A1 | 12/2006 | Wells | |
| 2007/0249170 A1 | 10/2007 | Kewley | |
| 2007/0281219 A1 | 12/2007 | Sandhu | |
| 2008/0057687 A1 | 3/2008 | Hunt et al. | |

FOREIGN PATENT DOCUMENTS

JP 02-143527 6/1990

(Continued)

OTHER PUBLICATIONS

Yang et al, Guided Self-Assembly of Symmetic Diblock Copolymer Films on Chemically Nanopatterned Substrates, Macromolecules, 2000, 33 (26), pp. 9575-9582.*

(Continued)

*Primary Examiner*—Amanda C. Walke
(74) *Attorney, Agent, or Firm*—Knobbe, Martens, Olson & Bear LLP

(57) ABSTRACT

A mask having features formed by self-organizing material, such as diblock copolymers, is formed on a partially fabricated integrated circuit. Initially, a copolymer template, or seed layer, is formed on the surface of the partially fabricated integrated circuit. To form the seed layer, diblock copolymers, composed of two immiscible blocks, are deposited in the space between copolymer alignment guides. The copolymers are made to self-organize, with the guides guiding the self-organization and with each block aggregating with other blocks of the same type, thereby forming the seed layer. Next, additional, supplemental diblock copolymers are deposited over the seed layer. The copolymers in the seed layer guide self-organization of the supplemental copolymers, thereby vertically extending the pattern formed by the copolymers in the seed layer. Block species are subsequently selectively removed to form a pattern of voids defined by the remaining block species, which form a mask that can be used to pattern an underlying substrate. The supplemental copolymers augment the height of the copolymers in the seed layer, thereby facilitating the use of the copolymers for patterning the underlying substrate.

32 Claims, 10 Drawing Sheets

FOREIGN PATENT DOCUMENTS

| | | |
|---|---|---|
| JP | 03-003375 | 1/1991 |
| JP | 2003 155365 | 5/2003 |
| WO | WO 2006/101695 | 9/2006 |
| WO | WO 2007/027686 | 3/2007 |

OTHER PUBLICATIONS

Park et al., "Enabling Nanotechnology with Self-Assembled Block Copolymer Patterns," *Polymer*, Elsevier Science Publishers, B.V., GB, vol. 44, No. 22 pp. 6725-6760 (Oct. 2003).
Rockford et al., "Polymers on Nanoperiodic, Heterogeneous Surfaces," *Physical Review Letters APS USA*, vol. 82, No. 12 (Mar. 22, 1999).
International Search Report (International Application No. PCT/US2007/011524).
Bates et al.; "Block Copolymers-Designer Soft Materials"; *Physics Today*; Feb. 1999, vol. 52, No. 2; pp. 32-38.
Black et al. "Nanometer-Scale Pattern Registration and Aignment by Directed Diblock Copolymer Self-Assembly," IEEE Transactions on Nanotechnology, vol. 3, No. 3 (Sep. 2004); pp. 412-415.
Black et al. "IBM demos new nanotechnology method to build chip components. Creates nanocrystal memory devices using self assembly technique compatible with conventional semiconductor processing," http://domino.research.ibm.com/comm/pr.nsf/pages/news.20031208_selfassembly.html; Dec. 8, 2003.
Callahan, Tim; "Pattern Formation"; Mathematics Department; www.math.lsa.umich.edu/~timcall/patterns/; Oct. 28, 2005; 5 pgs.
Carcia et al., "Thin films for Phase-shift Masks," *Vacuum and Thin Film*, IHS Publishing Group, (Sep. 14-21, 1999).
Cheng et al. "Fabrication of nanostructures with long-range order using block copolymer lithography," Applied Physics Letters, vol. 81, No. 19, pp. 3657-3659 (Nov. 4, 2002).
Cochran, Eric W.; Chemical Engineering-Iowa State University; www.iastate.edu/~ch_e/faculty/cochran.htm; Oct. 28, 2005; 2 pgs.
Edwards et al., "Precise Control over Molecular Dimensions of Block-Copolymer Domains Using the Interfacial Energy of Chemically Nanopatterned Substrates," *Advanced Materials*, 16, No. 15, (Aug. 4, 2004); pp. 1315-1319.
Fasolka et al.; "Block Copolymer Thin Films: Physics and Applications"; Annu. Rev. Mater. Res. 2001.31:323-355.
Guarini et al.; "Optimization of Diblock Copolymer Thin Film Self Assembly"; Adv. Mater. 2002, 14, No. 1, Sep. 16; pp. 1290-1294.
Guarini et al., "Low voltage, scalable nanocrystal FLASH memory fabricated by templated self-assembly," Electron Devices Meeting 2003, IEDM 03 Technical Digest. *IEEE International* Dec. 8-10, 2003, pp. 22.2.1-22.2.4.
Herr, Daniel J.C.; "The Extensibility of Optical Patterning Via Directed Self-Assembly of Nano-Engineered Imaging Materials"; Future Fab Intl.; www.future-fab.com; 8 pgs.; Oct. 27, 2005.
Jeong et al.; "Asymmetric Block Copolymers with Homopolymers: Routes to Multiple Length Scale Nanostructures"; Adv. Mater. 2002, 14, No. 4, Feb. 19; pp. 274-276.
Jeong et al.; "Volume Contractions Induced by Crosslinking: A Novel Route to Nanoporous Polymer Films"; Adv. Mater. 2003, 15, No. 15, Aug. 5; pp. 1247-1250.
Kim et al., "Epitaxial self-assembly of block copolymers on lithographically defined nanopatterned substrates," *Nature* 424, 411-414 (Jul. 24, 2003).
Limary et al.; "Block Copolymer Thin Films Above and Below the Order-Disorder Transition Temperature"; Mat.Res.Soc.Symp. vol. 629; (2000) Materials Research Society; 6 pgs.
Ngandu, K., "Resolution Enhancement Techniques for Optical Lithography," NNIN REU Research Accomplishments, 90-91 (2004).
Stoykovich et al., "Directed Assembly of Block Copolymer Blends into Nonregular Device-Oriented Structures," *Science*, vol. 308, 1442-1446 (Jun. 3, 2005).
Tirrell et al.; "Self-Assembly in Materials Synthesis"; MRS Bulletin; vol. 30; Oct. 2005; pp. 700-704.
Wang et al., "Symmetric diblock copolymer thin films confined between homogenous and patterned surfaces: Simulations and theory," *Journal of Chemical Physics* vol. 112, No. 22 (2000); pp. 9996-10010.
Zheng et al.; "Structural Evolution and Alignment of Cylinder-Forming PS-*b*-PEP Thin Films in Confinement Studied by Time-Lapse Atomic Force Microscopy"; Mater.Res.Soc.Symp.Proc. vol. 854E (2005) Materials Research Society; 4 pgs.
http://mrsec.uchicago.edu/Nuggets/Stripes/; Oct. 27, 2005; 3 pgs.
"Molecular Thermodynamics & Statistical Mechanics (MTSM) Research Group"; www.engr.wisc.edu/groups/mtsm/research.shtml; Oct. 28, 2005; 7 pgs.
"Polymer Research Laboratory"; www.princeton.edu/~polymer/block.html; Oct. 27, 2005; 2 pgs.
Chen et al., Achieving area-selective atomic layer deposition on patterned substrates by selective surface modification, Applied Physics Letters 86, 191910-1-191910-3 (2005).
Chou et al., Nanoimprint lithography, J.Vac. Sci. Technol. B 14(6), Nov./Dec. 1996, American Vacuum Society.
Park et al., Microcontact patterning of ruthenium gate electrodes by selective area atomic layer deposition, Applied Physics Letters 86, 051903 (2005).
Qin et al., on Wire Lithography, www.sciencemag.org, vol. 309, Jul. 1, 2005, p. 113-115.
Sinha et al., Area-Selective ALD of Titanium Dioxide Using Lithographically Defind Poly (methyl methacrylate) Films, Journal of the Electrochemical Society, 153 (5) G465-G469 (2006).
Sony CX-News vol. 29, 2002, Next Generation Low-Cost Electron Beam Lithography Fabrication Technology, www.sony.net/Products/SC-HP/cx_news/vol29/pdf/mask.pdf.
Choi et al., "Sublithographic nanofabrication technology for nanocatalysts and DNA chips," *J.Vac. Sci. Technol.*, pp. 2951-2955 (Nov./Dec. 2003).
PCT International Search Report of Sep. 26, 2008, International Application No. PCT/US2008/063943, Filed: May 16, 2008.
Nealy et al, "Directed assembly of imaging layers for sub-30 nm lithography", *First International Nanotechnology Conference on Communication and Cooperation*, Jun. 2005, 2 pages.
U.S. Office Action of Apr. 17, 2008 in U.S. Appl. No. 11/389,581, filed Mar. 23, 2006.

\* cited by examiner

TOPOGRAPHY BASED PATTERNING

REFERENCE TO RELATED APPLICATIONS

This application is related to U.S. patent application Ser. No. 11/389,581 to Gurtej Sandhu, filed Mar. 23, 2006, entitled Topography Directed Patterning, the entire disclosure of which is incorporated by reference herein.

BACKGROUND OF THE INVENTION

1. Field of the Invention

This invention relates generally to integrated circuit fabrication and, more particularly, to printing techniques.

2. Description of the Related Art

As a consequence of many factors, including demand for increased portability, computing power, memory capacity and energy efficiency, integrated circuits are continuously being made more dense. The sizes of the constituent features, e.g., electrical devices and interconnect lines, that form the integrated circuits are constantly being decreased to facilitate this scaling.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically comprises millions of identical circuit elements, known as memory cells. In general, a capacitor-based memory cell, such as in conventional DRAM, typically includes two electrical devices: a storage capacitor and an access field effect transistor. Each memory cell is an addressable location that can store one bit (binary digit) of data. A bit can be written to a cell through the transistor and can be read by sensing charge in the capacitor. Some memory technologies employ elements that can act as both a storage device and a switch (e.g., dendritic memory employing silver-doped chalcogenide glass) and some nonvolatile memories do not require switches for each cell (e.g., magnetoresistive RAM) or incorporate switches into the memory element (e.g., EEPROM for flash memory). By decreasing the sizes of the electrical devices that constitute a memory cell and the sizes of the conducting lines that access the memory cells, the memory devices can be made smaller. Additionally, storage capacities can be increased by fitting more memory cells on a given area in the memory devices. The need for reductions in feature sizes, however, is more generally applicable to integrated circuits, including general purpose and specialty processors.

The continual reduction in feature sizes places ever greater demands on the techniques used to form the features. For example, photolithography is commonly used to pattern these features. Typically, photolithography involves passing light through a reticle and focusing the light onto a photochemically-active photoresist material. Just as a slide has an image to be projected onto a screen, the reticle typically has a pattern to be transferred to a substrate. By directing light or radiation through the reticle, the pattern in the reticle can be focused on the photoresist. The light or radiation causes a chemical change in the illuminated parts of the photoresist, which allows those parts to be selectively retained or removed, depending on whether positive or negative photoresist is used, relative to parts which were in the shadows. Thus, the exposed and unexposed parts form a pattern in the photoresist. It will be appreciated that this pattern can be used as a mask to form various features of an integrated circuit, including conductive lines or parts of electrical devices.

Because lithography is typically accomplished by projecting light or radiation onto a surface, the ultimate resolution of a particular lithography technique depends upon factors such as optics and light or radiation wavelength. For example, the ability to focus well-defined patterns onto resist depends upon the size of the features and on the wavelength of the radiation projected through the reticle. It will be appreciated that resolution decreases with increasing wavelength, due, among other things, to diffraction. Thus, shorter wavelength radiation is typically required to form well-resolved features, as the sizes of the features decrease. Consequently, to facilitate reductions in feature sizes, lower and lower wavelength systems have been proposed.

For example, 365 nm, 248 nm, 193 nm and 157 nm wavelength systems have been developed as features sizes have decreased. Additional reductions in feature sizes, e.g., down to 20 nm features, may require even shorter wavelength systems. For example, X-ray based lithography, using X-ray radiation instead of light, has been proposed to form very small features, such as 20 nm features. Another proposed technology is extreme ultraviolet (EUV) lithography, using, e.g., 13.7 nm radiation. X-ray and EUV lithography, however, are expected to be prohibitively expensive to implement. In addition to cost, the techniques face various technical obstacles. For example, for X-ray lithography, these obstacles include difficulties in forming high quality reticles which are sufficiently opaque to X-rays and difficulties in devising resists which are sufficiently sensitive to the X-rays. Moreover, rather than using optics to focus radiation on the resist, some X-ray systems place the reticle close to the resist, to directly expose the resist to X-rays passing through the reticle. This can cause complications in aligning the reticle with the resist and, in addition, places significant demands on the flatness of both the reticle and the resist. In addition, X-ray lithography can use reflective as opposed to refractive optics, which can require a complete redesign of optical elements and related systems. Similarly, other high resolution lithography techniques, including ion beam and electron beam lithography, have their own technical and practical obstacles, including high complexity and costs.

Accordingly, there is a continuing need for high resolution methods to pattern small features on semiconductor substrates.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENTS

Figure 1:
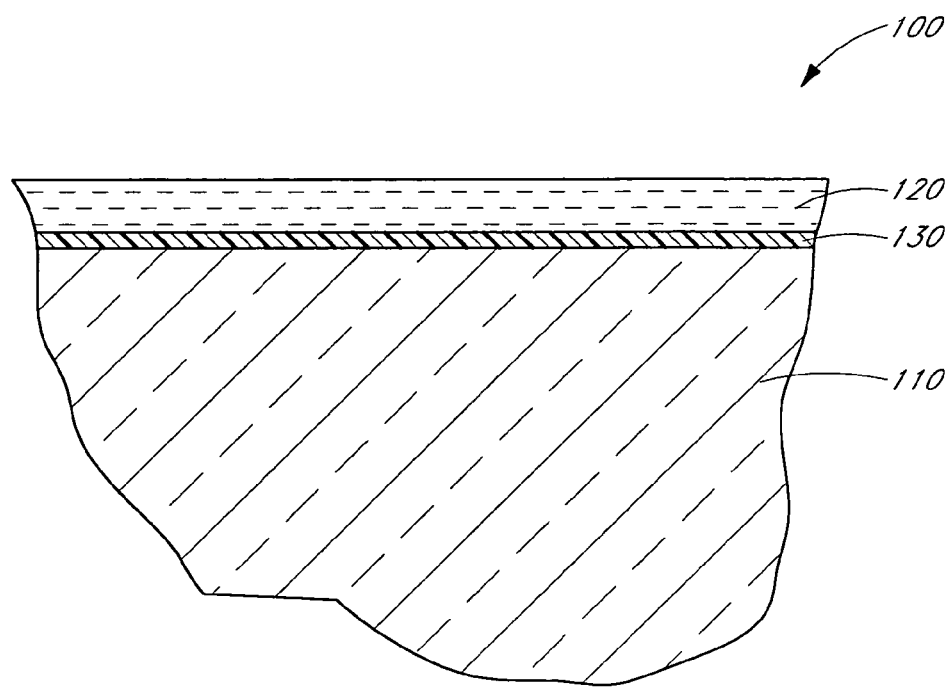
FIG. 1 is a schematic cross-sectional side view of a partially formed integrated circuit, in accordance with preferred embodiments of the invention.

The ability of block copolymers to self-organize can be used to form mask patterns. Block copolymers are formed of two or more chemically distinct blocks. For example, each block can be formed of a different monomer. The blocks are preferably immiscible or thermodynamically incompatible, e.g., one block can be polar and the other can be non-polar. Due to thermodynamic effects, the copolymers will self-organize in solution to minimize the energy of the system as a whole; typically, this causes the copolymers to move relative to one another, e.g., so that like blocks aggregate together, thereby forming alternating regions containing each block type or species. For example, if the copolymers are formed of polar and non-polar blocks, the blocks will segregate so that non-polar blocks aggregate with other non-polar blocks and polar blocks aggregate with other polar blocks. It will be appreciated that the block copolymers may be described as a self-organizing material since the blocks can move to form a pattern without application of an external force to direct the movement of particular individual molecules, although heat may be applied to increase the rate of movement of the population of molecules as a whole.

In addition to interactions between the block species, the self-organization of block copolymers can be influenced by topographical features, such as steps on the surface on which the block copolymers are deposited. For example, a diblock copolymer, a copolymer formed of two different block species, can form alternating regions which are each formed of a substantially different block species. When self-organization of block species occurs in the area between the walls of a step, the steps can interact with the blocks such that, e.g., each of the alternating regions formed by the blocks can be made to form a regular pattern with features oriented parallel to the walls. In addition, the self-organization of block copolymers can be guided by photolithographically modifying a surface, without forming steps in the surface, as disclosed in: Stoykovich et al., Science 308, 1442 (2005); Kim et al., Nature 424, 411 (2003); and Edwards et al., Adv. Mater. 16, 1315 (2004). The entire disclosure of each to these references is incorporated by reference herein.

Such self-organization can be useful in forming masks for patterning features during semiconductor fabrication processes. For example, one of the alternating regions can be removed, thereby leaving the material forming the other region to function as a mask. The mask can be used to pattern features such as electrical devices in an underlying semiconductor substrate. An exemplary process for forming a copolymer mask is disclosed in U.S. patent application Ser. No. 11/389,581 to Gurtej Sandhu, filed Mar. 23, 2006, entitled TOPOGRAPHY DIRECTED PATTERNING, (Micron Ref. No.: 2005-0865), the entire disclosure of which is incorporated by reference herein.

It will be appreciated that the thickness of a copolymer film can influence the self-organization of the copolymers and the pattern formed by the copolymers. Thus, depending on the desired pattern, the copolymer film can thin, leading to the formation of a thin mask. Because processing through the mask, e.g., etching an underlying substrate through the mask, can cause some wearing away of the mask, the mask may be too thin for some applications. For example, if an etch chemistry has insufficient selectivity for the substrate, the mask may be undesirably worn away before a pattern transfer to the substrate is complete.

In preferred embodiments of the invention, the height of the self-organized copolymers is augmented to increase the thickness of the mask formed by the copolymers. Guide features are patterned and trimmed over a substrate to achieve a desired spacing between the guide features. A film of copolymers is deposited and the copolymers are made to self-organize between guide features to form an initial mask layer having alternating domains, with each domain formed substantially of like block species. For example, the domains can be lines, with lines formed substantially of polar block species alternating with lines formed substantially of non-polar block species.

The height of the initial mask layer is then preferably augmented using a self-organizing material, preferably additional, supplemental block copolymers, deposited over the initial mask layer. It will be appreciated that the organized copolymers of the initial mask layer allow the initial mask layer to act as a copolymer template or seed layer, which guides the supplemental copolymers to form a desired pattern. Preferably, particular block species of the supplemental copolymers preferentially align with particular block species in the copolymer template, effectively vertically extending the block domains in the copolymer template. In some embodiments, the supplemental copolymers and the template copolymers are the same, so that like block species aggregate together. Some of the blocks from both the template and the supplemental copolymer layer are subsequently selectively removed. The remaining block species can be used as a mask for patterning of underlying materials, e.g., during the fabrication of integrated circuits.

Advantageously, the preferred embodiments allow the formation of small, closely-spaced step features which might otherwise need to be formed using newer, relatively complex and expensive lithography techniques. Conventional, proven and relatively inexpensive lithography techniques can be utilized to form guides for directing the self-organization of block copolymers. Moreover, the self-organizing behavior of block copolymers allows the reliable formation of very small features, thereby facilitating the formation of a mask with a very small feature size. For example, features having a critical dimension of about 1 nm to about 100 nm, more preferably, about 2 nm to about 50 nm and, more preferably, about 3 nm to about 30 can be formed.

In addition, augmentation of the mask features advantageously allows the masks to be used in applications where a single self-organized copolymer mask is too thin for effective processing. For example, the augmented mask can be used in applications where the substrate is difficult to etch, requiring a long or aggressive etch (e.g., when etching multiple disparate substrate materials), or where etch chemistries still remove a significant amount of copolymer material due to low etch selectivity for substrate material. Moreover, higher quality patterns are possible, since the augmentation minimizes the need to form a thick initial copolymer mask, thereby allowing the formation of the template mask to be optimized for forming well-defined features, rather than optimizing for thicknesses sufficient to directly pattern a substrate.

Reference will now be made to the Figures, wherein like numerals refer to like parts throughout. It will be appreciated that the Figures are not necessarily drawn to scale.

In a first phase of methods according to the preferred embodiments, a copolymer template or seed layer is formed. With reference to FIG. 1, a cross-sectional side view of a partially formed integrated circuit 100 is illustrated. Masking layers 120, 130 are preferably provided above a substrate 110 to form guides for copolymer alignment. The materials for the layers 120, 130 overlying the substrate 110 are preferably chosen based upon consideration of the interaction of the layers with block copolymer materials to be used and of the chemistry and process conditions for the various pattern forming and pattern transferring steps discussed herein. For example, because patterns in upper layers are preferably transferred to lower layers, the lower masking layer 130 is preferably chosen so that it can be selectively etched relative to other exposed materials. It will be appreciated that a material is considered selectively, or preferentially, etched when the etch rate for that material is at least about 2-3 times greater, preferably at least about 10 times greater, more preferably at least about 20 times greater and, most preferably, at least about 50 times greater than that for surrounding materials. Because an objective for the masks formed herein is to allow well-defined patterns to be formed in the substrate 110, it will be appreciated that one or more of the layers 120, 130 can be omitted or substituted, or additional layers can be added, if suitable other materials, chemistries and/or process conditions are used for pattern forming and transfer.

It will be appreciated that the "substrate" to which patterns are transferred can include a single material, a plurality of layers of different materials, a layer or layers having regions of different materials or different structures in them, etc. These materials can include semiconductors, insulators, conductors, or combinations thereof. For example, the substrate can comprise doped polysilicon, a single crystal electrical device active area, a silicide, or a metal layer, such as a tungsten, aluminum or copper layer, or combinations thereof. In some embodiments, the mask features discussed below can directly correspond to the desired placement of conductive features, such as interconnects, in the substrate. In other embodiments, the substrate can be an insulator and the location of mask features can correspond to the desired location of insulation between conductive features, such as in damascene metallization. The mask features can be used as a hard mask to directly etch the substrate, or can be used to transfer a pattern to another underlying layer, e.g., a carbon, preferably transparent carbon, layer, which is then used to transfer the pattern to one or more underlying layers, such as the substrate.

With continued reference to FIG. 1, the selectively definable layer 120 overlies a hard mask, or etch stop, layer 130, which overlies the substrate 110. The selectively definable layer 120 is preferably photodefinable, e.g., formed of a photoresist, including any photoresist known in the art. For example, the photoresist can be any photoresist compatible with extreme ultraviolet systems (e.g., 13.7 nm wavelength systems), 157 nm, 193 nm, 248 nm or 365 nm wavelength systems, or 193 nm wavelength immersion systems. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems. In addition, while the preferred embodiments can obviate the need to define extremely small features with expensive, relatively new direct formation techniques such as extreme ultraviolet systems (including 13.7 nm wavelength systems) or electron beam lithographic systems, such systems can also be used, if desired. In addition, maskless lithography, or maskless photolithography, can be used to define the selectively definable layer 120. In other embodiments, the layer 120 and any subsequent resist layers can be formed of a resist that can be patterned by nano-imprint lithography, e.g., by using a mold or mechanical force to form a pattern in the resist.

The material for the hard mask layer 130 preferably comprises an inorganic material, which is not a polymer. Exemplary materials include silicon oxide ($SiO_2$), silicon or a dielectric anti-reflective coating (DARC), such as a silicon-rich silicon oxynitride. The hard mask layer 130 comprises silicon oxide in the illustrated embodiment.

Figure 2:
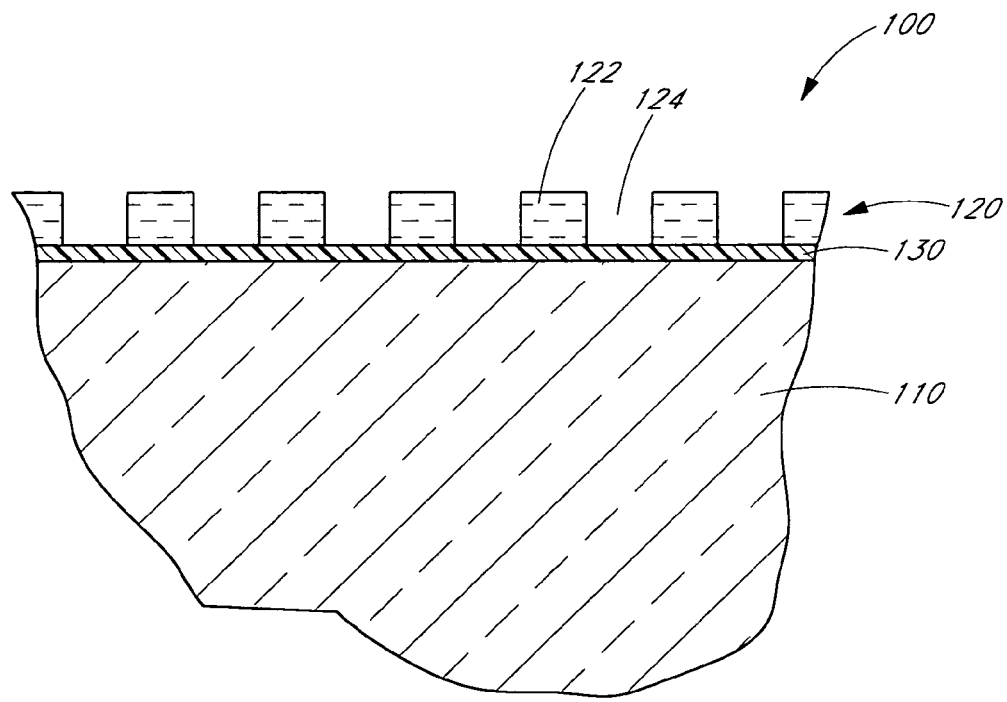
FIG. 2 is a schematic cross-sectional side view of the partially formed integrated circuit of FIG. 1 after forming features in a photoresist layer, in accordance with preferred embodiments of the invention.

With reference to FIG. 2, the photodefinable layer 120 is exposed to radiation through a reticle and then developed to leave a pattern comprising features 122 which are formed of photodefinable material. It will be appreciated that the pitch of the resulting features 122, e.g., lines, is equal to the sum of the width of a line 122 and the width of a neighboring space 124. The pitch of the features 122 can be, e.g., about 400 nm or less, preferably, about 300 nm or less, more preferably, about 200 nm or less or about 100 or less. In an exemplary embodiment, the features 122 can have a critical dimension of about 140 nm and a pitch of about 280 nm.

Figure 3:
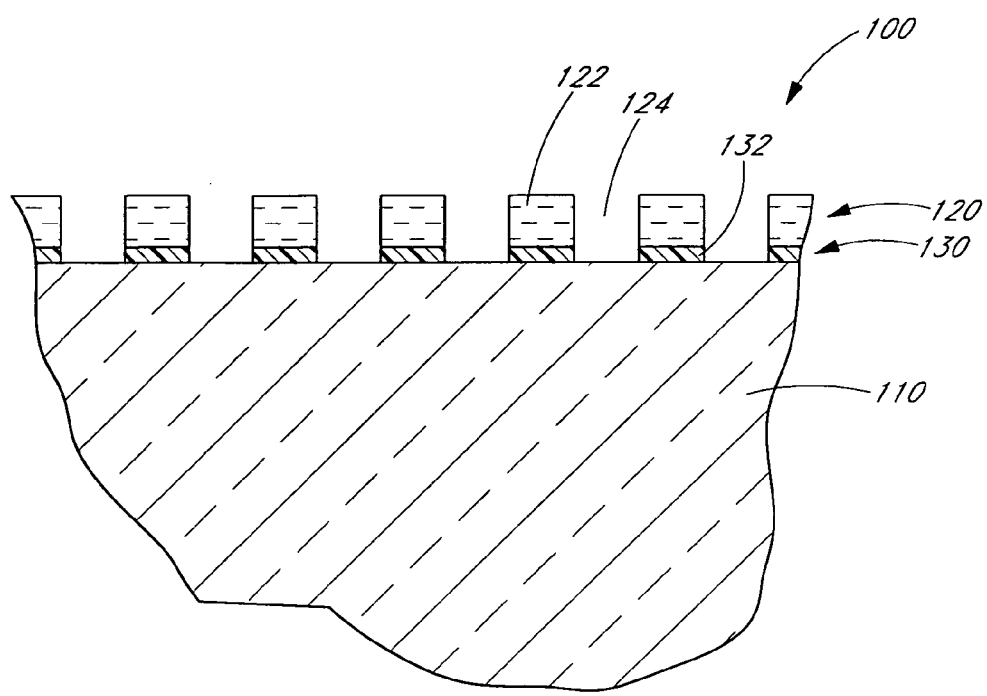
FIG. 3 is a schematic cross-sectional side view of the partially formed integrated circuit of FIG. 2 after etching through a hard mask layer, in accordance with preferred embodiments of the invention.
Figure 4:
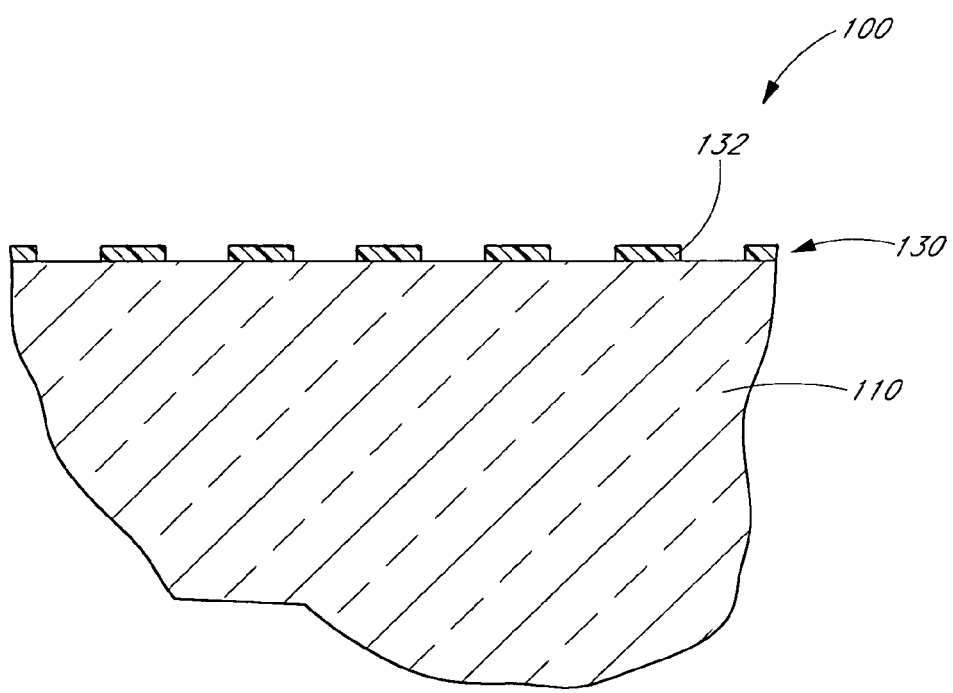
FIG. 4 is a schematic cross-sectional side view of the partially formed integrated circuit of FIG. 3 after removing the photoresist layer, in accordance with preferred embodiments of the invention.

With reference to FIG. 3, the pattern in the photodefinable layer 120 is transferred to the hard mask layer 130, thereby forming hard mask features 132 in the hard mask layer 130. The pattern transfer is preferably accomplished using an anisotropic etch, such as an etch using a fluorocarbon plasma, although a wet (isotropic) etch may also be suitable if the hard mask layer 130 is sufficiently thin. Exemplary fluorocarbon plasma etch chemistries include $CFH_3$, $CF_2H_2$, $CF_3H$ and $CF_4$/HBr. With reference to FIG. 4, resist forming the photo-definable layer 120 is also preferably removed, e.g., by plasma ashing.

Figure 5:
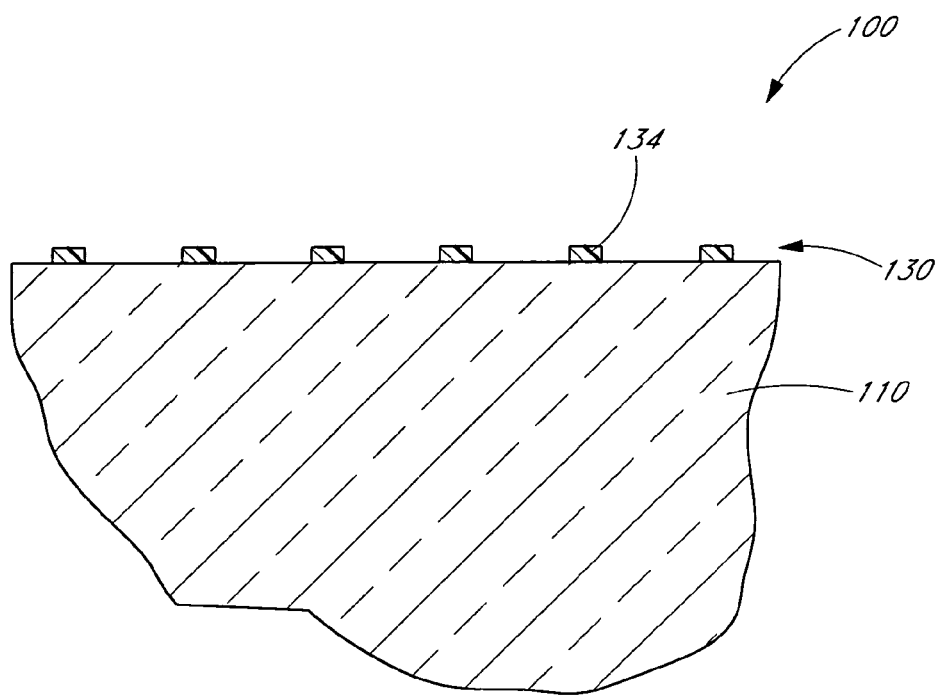
FIG. 5 is a schematic, cross-sectional side view of the partially formed integrated circuit of FIG. 4 after widening spaces between lines in the hard mask layer, in accordance with preferred embodiments of the invention.

With reference to FIG. 5, the hard mask features 132 (FIG. 4) are trimmed to form guides 134 for copolymer alignment. The hard mask features 132 can be trimmed using a wet or dry etch. The trim advantageously allows the formation of features having smaller critical dimensions than could easily be formed using conventional photolithography. For example, hard mask features 132 having a critical dimension of about 140 nm and a pitch of about 280 nm can be trimmed to form guides 134 having a critical dimension of about 35 nm and the same pitch of about 280 nm. In other embodiments, the photoresist features 122 (FIG. 2) can be trimmed in addition to, or instead of, the hard mask features 132, thereby allowing guides 134 of the desired size to be formed without the need to trim the hard mask features 132.

Block copolymers are next applied and block copolymer self-organization is facilitated to form a mask pattern over the substrate 110. A suitable method for forming self-organized block copolymer patterns is disclosed in Block, IEE Transactions in Nanotechnology, Vol. 3, No. 3, September 2004. The entire disclosure of that reference is incorporated by reference herein.

Figure 6:
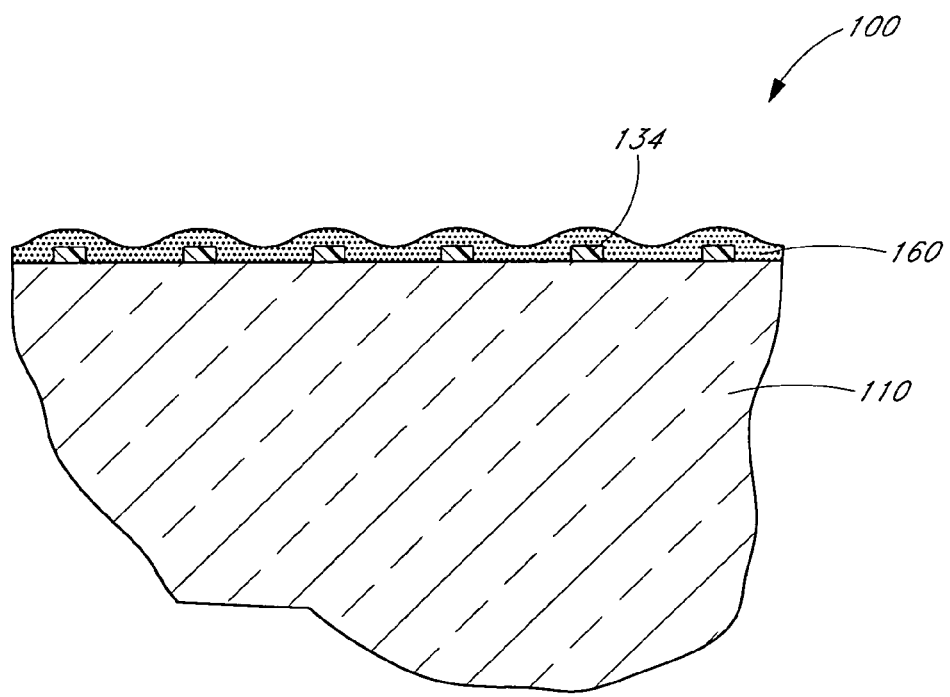
FIG. 6 is a schematic, cross-sectional side view of the partially formed integrated circuit of FIG. 5 after depositing a layer of a block copolymer solution, in accordance with preferred embodiments of the invention.

With reference to FIG. 6, a film 160 of block copolymer material is deposited between and over the guides 134. The copolymer comprises blocks of polymer material which can be selectively etched relative to one another and which can self-organize in a desired and predictable manner, e.g., the blocks are preferably immiscible and will segregate under appropriate conditions to form domains predominantly containing a single block species. In the exemplary illustrated embodiment, the copolymer is a diblock copolymer, comprising, e.g., polystyrene (PS) and poly-methylmethacrylate (PMMA) in a 70:30 PS:PMMA ratio with a total molecular weight of 64 kg/mol. The diblock copolymers can be provided dissolved in a solvent, e.g., toluene. Preferably, each of the copolymers are substantially the same size and composition, to increase the predictability and regularity of the patterns formed by the self-organization of the copolymers. It will be appreciated that the total size of each diblock copolymer and the ratio of the constituent blocks and monomers are preferably chosen to facilitate self-organization and to form organized block domains having desired dimensions. For example, it will be appreciated that a block copolymer has an intrinsic polymer length scale, the average end-to-end length of the copolymer in film, including any coiling or kinking, which governs the size of the block domains. A copolymer solution having longer copolymers may be used to form larger domains and a copolymer solution having shorter copolymers may be used to form smaller domains. The block copolymers can be deposited by various methods, including, e.g., spin-on coating, spin casting, brush coating or vapor deposition.

Figure 8:
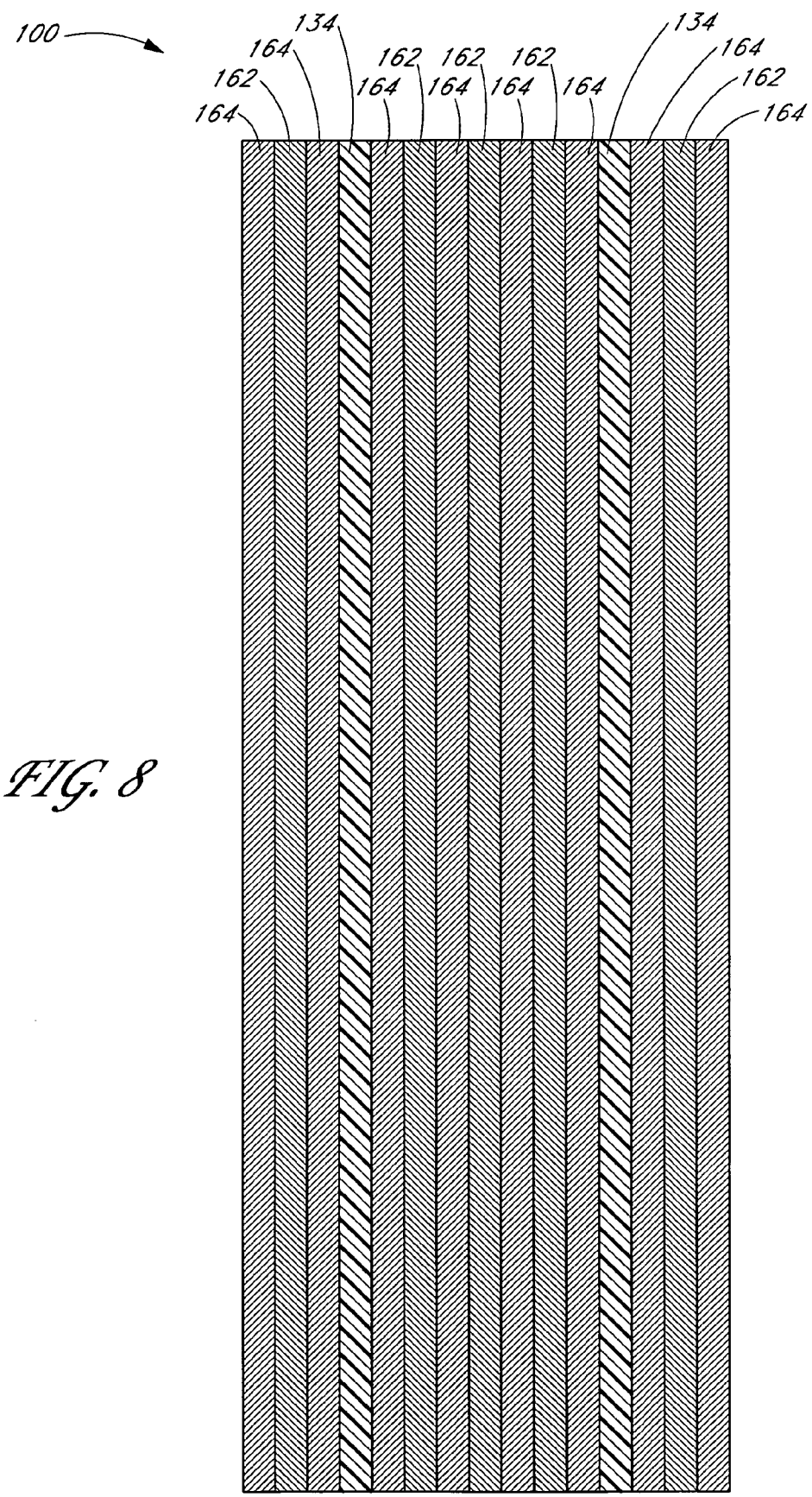
FIGS. 8 and 9 are schematic, top plan views of the partially formed integrated circuit of FIG. 7 showing exemplary possible copolymer arrangements resulting from the self-organization of the block copolymers, in accordance with preferred embodiments of the invention.
Figure 9:
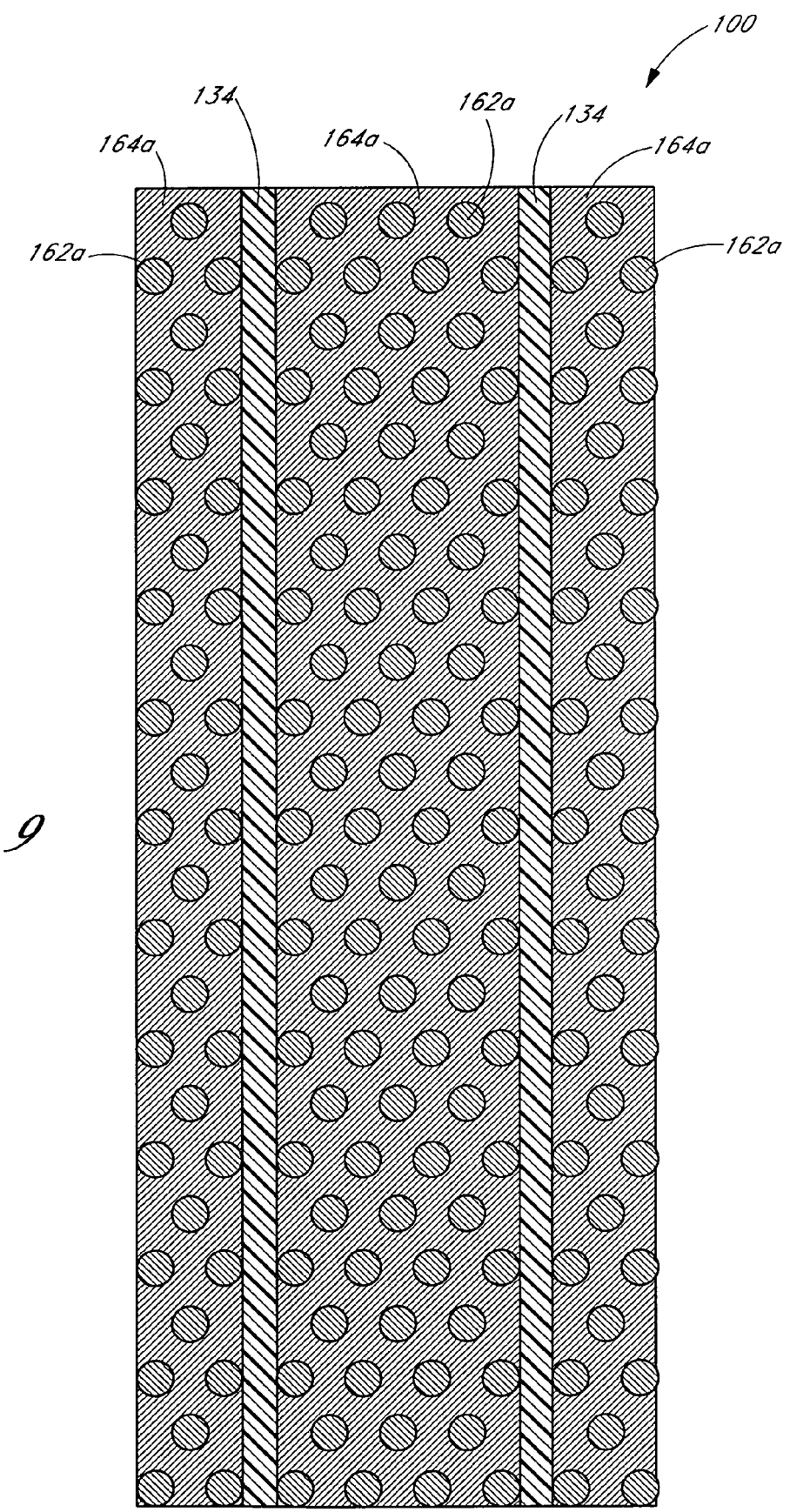

The thickness of the copolymer film 160 can be chosen based upon the desired pattern to be formed by the copolymers. It will be appreciated that, up to a particular thickness related to the polymer length scale and the environment in which the polymers are disposed, e.g., the distance between and the height of the guides 134, the copolymers will typically orient to form alternating, substantially lamellar domains that form parallel lines, as viewed in a top-down view (FIG. 8). Such lamellae can be used to pattern, e.g., interconnects, or the lateral extension of the lamellae can be limited to form isolated features, e.g., transistor gates. Above a particular thickness related to the polymer length scale and the environment in which the polymers are disposed, the copolymers will typically orient to form vertically-extending pillars, such as cylinders, or spheres (FIG. 9). The cylinders can advantageously be used to pattern isolated features, e.g., vias or transistor gates. Thus, the pattern to be formed can advantageously be selected by appropriate selection of copolymer film thickness. Alternatively, other variables, such as copolymer composition or process conditions can be modified to facilitate the formation of vertically extending pillars or horizontally extending lamellae for a given thickness through appropriate selection of interfacial interactions between the blocks of the copolymer as well as the substrate surfaces.

For forming lamellae, the copolymer film thickness is preferably less than about the length scale of the copolymers forming the film. For example, where the copolymer length scale is about 35 nm, the thickness of the films is preferably about 35 nm or less, more preferably, about 30 nm or less and, most preferably, about 25 nm or less. In one embodiment, the thickness is about 20 nm.

It will be appreciated that the thickness of the film 160 can be greater than, equal to or less than the height of the guides 134. As illustrated and discussed further below, a thickness which is greater than the height of the guides 134 can have advantages for providing a copolymer reservoir. In other embodiments, a thickness which is equal to or, more preferably, less than the height of the guides 134 can be advantageous by forming isolated islands of copolymers between the guides 134, thereby preventing cross-diffusion of copolymers between the islands.

While the invention is not bound by theory, it will be appreciated that the different block species can self-aggregate due to thermodynamic considerations in a process similar to the phase separation of materials. The self-organization is guided by the guides 134, which encourage the constituent blocks of the block copolymers to orient themselves along the length of the guides 134 due to interfacial interactions. It will be appreciated that the self-organization can result in a more efficient packing of the copolymer species. As a result, in some cases, the free copolymers available for the self-organization can be depleted if the copolymer film 160 extends over too large of an expanse, causing an area in the middle of the expanse to be formed without organized copolymers. Thus, in some embodiments, the copolymer film 160 is preferably sufficient thick to extend above the guides 134 to provide a reservoir of copolymers for the self-organization which occurs between the guides 134. In addition, the distance between the guides 134 can be chosen to be sufficiently small to minimize the depletion effect that can occur over large expanses.

Figure 7:
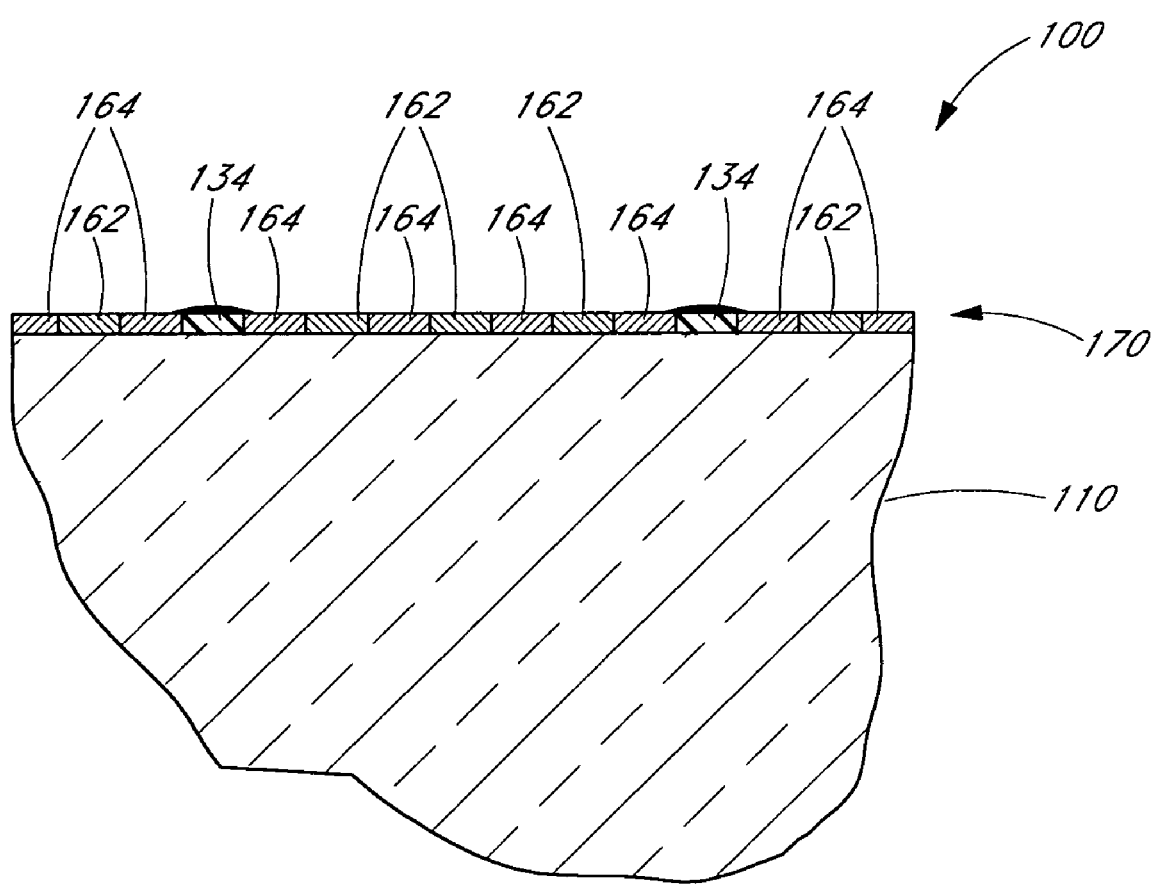
FIG. 7 is a schematic, cross-sectional side view of the partially formed integrated circuit of FIG. 6 after self-organization of the block copolymers to form a copolymer template or seed layer, in accordance with preferred embodiments of the invention.

With reference to FIG. 7, the block copolymers in the copolymer film 160 are allowed to self-organize. The self-organization can be facilitated and accelerated by annealing the partially-fabricated integrated circuit 100. The temperature of the anneal is preferably chosen to be sufficiently low to prevent adversely affecting the block copolymers or the partially-fabricated integrated circuit 100. In the illustrated embodiment, the anneal is preferably performed at a temperature of less than about 250° C., more preferably, less than about 200° C. and, most preferably, about 180° C. Advantageously, the anneal can also cause cross-linking of the copolymers, thereby stabilizing the copolymers for later etching and pattern transfer steps.

The pattern of lamellae resulting after the anneal is shown in FIG. 7. Domains 162 of one block species, e.g., PS, and domains 164 of the other block species, e.g., PMMA, alternate between the guides 134. It will be appreciated that the sizes of the block domains are determined by the sizes of the block species forming them. Thus, a seed layer or copolymer template 170 is formed.

With reference to FIG. 8, a top-down view of the partially fabricated integrated circuit of FIG. 7 is shown. The PS domains 162 can be seen alternating with the PMMA domains 164. Both domains 162 and 164 extend along the length of the guides 134.

With reference to FIG. 9, in other embodiments, the thickness of the copolymer film 160 (FIG. 6) is chosen so as to form vertically extending cylinders (or other isolated pillar shapes, including pillars having rectangular or cubic horizontal cross-sectional areas) comprising PS and PMMA, and the guides 134 are preferably chosen with a height sufficient to guide the copolymer blocks such that rows of the cylinders align in a desired direction. The resulting arrangement, from a top-down view, has regions 162a of PS surrounded by regions 164a of PMMA. Such an arrangement can be useful for forming, e.g., contact vias. In addition, the pillars can advantageously be applied in some arrangements for patterning arrays of features, particularly dense arrays of features, such as capacitors for memory applications, including DRAM. In such arrangements, the pillars can have a cylindrical, a rectangular or cubic horizontal cross-sectional area, with the rectangular or cubic pillars having advantages in some applications by providing a higher surface area structure.

Figure 10:
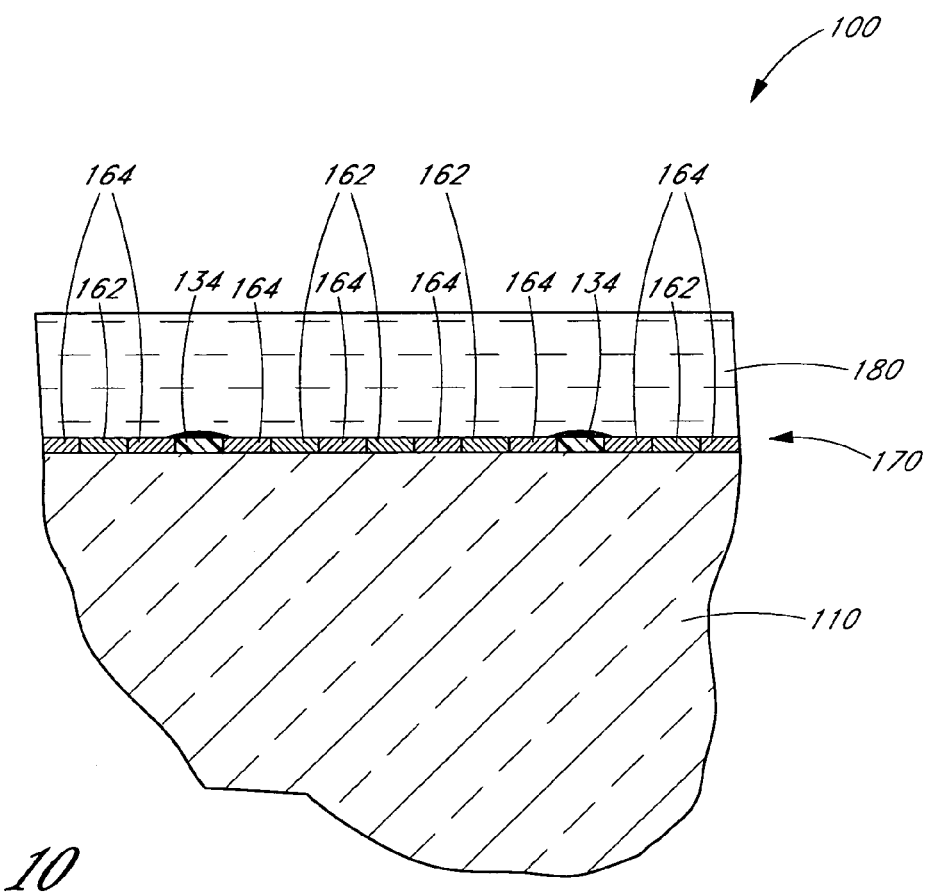
FIG. 10 is a schematic, cross-sectional side view of the partially formed integrated circuit of FIG. 7 after depositing an additional layer of block copolymers, in accordance with preferred embodiments of the invention.

With reference to FIG. 10, a supplemental layer 180 of self-organizing material is deposited over the seed layer 170 to vertically extend the pattern in the seed layer 170. The self-organizing material forming the supplement layer 180 is preferably a copolymer, more preferably a block copolymer. The material forming the supplemental layer 180 is chosen to interact with the seed layer 170 such that the domains 162, 164 and the guides 134 of the seed layer 170 are able to direct the organization of chemical species forming the material. For example, where the seed layer 170 includes polar and non-polar block species, the layer can also have polar and non-polar block species. In some embodiments, supplemental block copolymers forming the layer 180 are the same as the block copolymers of the film 160 (FIG. 6), although in other embodiments the block copolymers can be different but have chemical moieties which allow them to interact predictably with one another. Where the block species are the same, the supplemental copolymers can have the same length or different lengths from the copolymers of the film 160, although the lengths and the concentration or volume fraction of the supplemental copolymers in the supplemental layer 180 are preferably chosen to facilitate extending the pattern of the seed layer 170 into the supplemental layer 180. In addition, it will be appreciated that the supplemental layer 180 is preferably deposited to a height sufficient to form a copolymer mask with a desired height for etching underlying materials. The supplemental layer 180 can have a thickness greater than the intrinsic length scale of the copolymers forming it. Preferably, the supplemental layer 180 can have a height of about 10 nm to about 50 nm and, more preferably, about 10 nm to about 200 nm.

Figure 11:
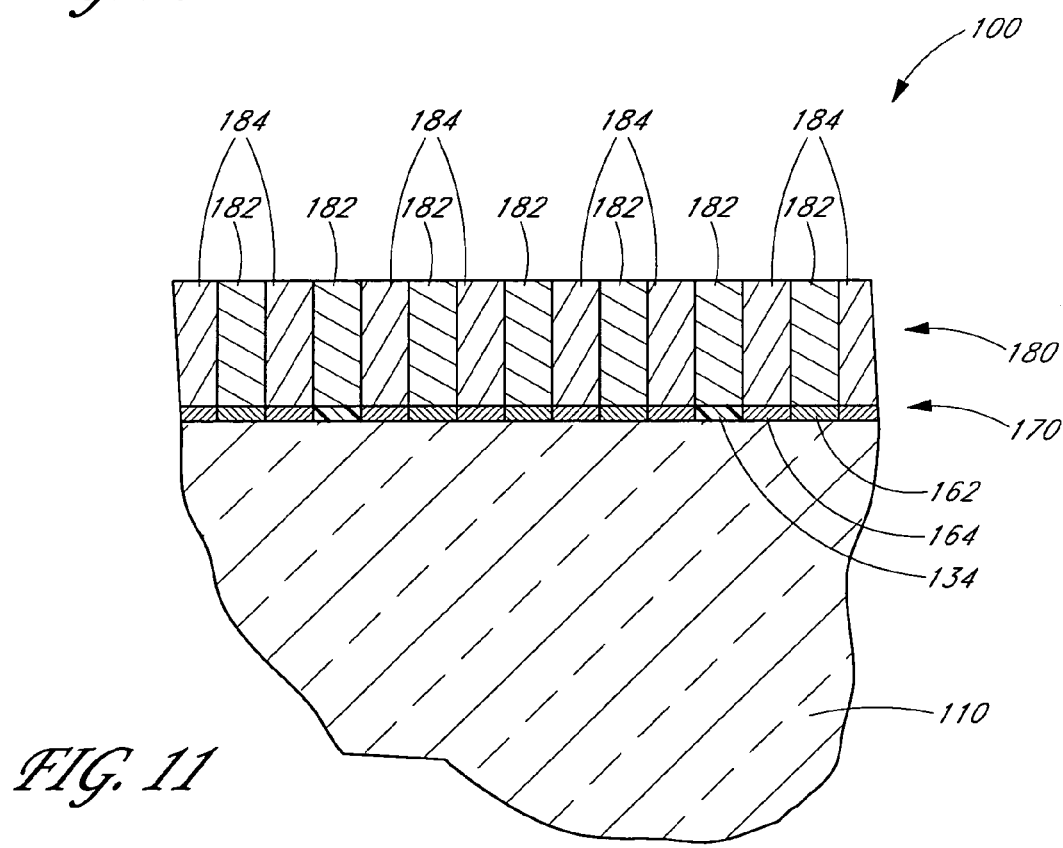
FIG. 11 is a schematic, cross-sectional side view of the partially formed integrated circuit of FIG. 10 after self-organization of the block copolymers in the additional layer of block copolymers, in accordance with preferred embodiments of the invention.

With reference to FIG. 11, interactions between the supplemental copolymers of the supplemental layer 180 and the domains 162, 164 and the guides 134 cause the supplemental copolymers to organize into domains 182, 184. In some embodiments, this self-organization can be accelerated by subjecting the supplemental layer 180 to an anneal such as that discussed above for the film 160 (FIG. 6). The anneal can advantageously cause cross-linking of the copolymers, thereby helping to stabilize the copolymer blocks, especially during later selective block removal steps.

With continued reference to FIG. 11, the domains 182, 184 advantageously align to form the same pattern as the domains 162, 164, as viewed from a top down view. Thus, the pattern formed by the domains 162, 164 may be said to be transferred to the supplemental layer 180 and effectively vertically extending the domains 162, 164. Preferably, the domains 162, 164 are organized in a substantially regular pattern and the domains 182, 184 are also organized in a substantially regular pattern.

Advantageously, the supplemental copolymers can repair defects in the pattern formed in the seed layer 170. For example, the seed layer 170 may include domains 162, 164 which define features, such as lines, which have very rough edges or non-uniformities in critical dimensions. Initially, certain chemical moieties or blocks of the supplemental copolymers will align themselves with particular block domains 162, 164 of the seed layer 170, which contain other chemical moieties which interact favorably with the blocks of the supplemental copolymers, e.g., to encourage wetting of particular domains with particular blocks in the supplemental copolymers. As the number of organized supplemental copolymers grows and the heights of the organized supplemental copolymer domains 182, 184 increase, however, the supplemental copolymers and process conditions may be selected such that interactions between the supplemental copolymers dominate. Advantageously, because the interactions between the blocks of the supplemental copolymers can be relatively homogeneous across the supplemental layer 180, the dominance of the interactions between the blocks can cause the blocks to self-segregate and form domains 182, 184 which are more regular and better defined than the domains 162, 164 in the copolymer template. Thus, the domains 182, 184 in the supplemental layer 180 can have greater uniformity in pitch and critical dimension than the domains 162, 164 of the seed layer 170.

In addition, the supplemental copolymers can also advantageously level out non-uniformities in thickness in the seed layer 170. For example, a relatively thick layer 180 of deposited supplemental copolymers may be less prone to form localized regions of different thicknesses than the seed layer 170, which can have thickness variations caused by interfacial interactions with an underlying surface, or by depletion of the copolymers in the copolymer template before all block domains are fully formed. As a result, because the supplemental copolymers can form domains up to a height proportional to the height of the supplemental copolymer layer, the final mask formed by the supplemental copolymers can advantageously have a more uniform thickness and, thus, greater uniformity in height.

Figure 12:
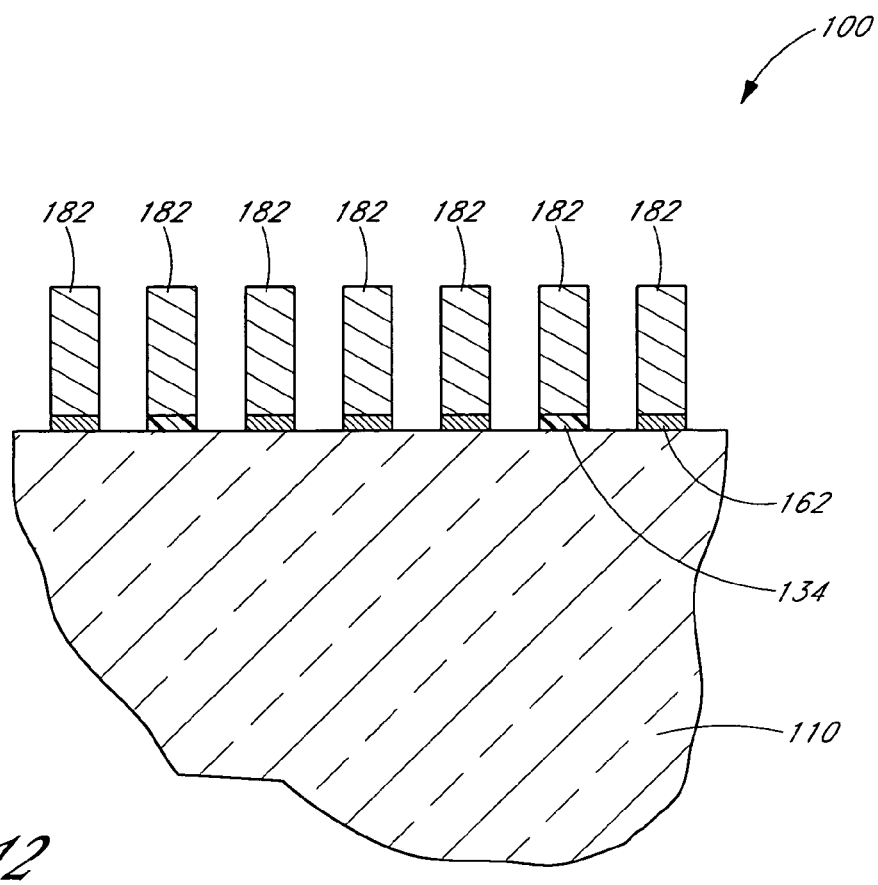
FIG. 12 is a schematic, cross-sectional side view of the partially formed integrated circuit of FIG. 11 after selectively removing a block copolymer species in the additional layer of block copolymers and in the copolymer template, in accordance with preferred embodiments of the invention.

With reference to FIG. 12, the domains 184, 164 are selectively removed, leaving behind the domains 182, 162 and the guides 134. It will be appreciated that the domains 184, 164 can be removed in a single step using a single etch chemistry or can be removed using multiple etches with different etch chemistries. For example, where the domains 184, 164 are both formed of PMMA and the domains 182, 162 are formed of PS, the domains 184, 164 can be removed by performing a selective wet etch, e.g., using acetic acid as an etchant. In other embodiments, a dry or anisotropic etch may be appropriate where one of the domains can be etched at a faster rate than the other. It will be appreciated that the dimensions of the resulting features can vary, depending on the size of the copolymer used and process conditions. In some embodiments, the resulting pattern can advantageously comprise PS domains having a critical dimension of about 50 nm to about 2 nm, more preferably, about 35 nm or less to about 3 nm, with a pitch of about 100 nm to about 4 nm and, more preferably, about 70 nm to about 6 nm. For example, the PS domains can have a critical dimension of about 35 nm, with a pitch of about 70 nm. It will be appreciated that in other embodiments, the domains 162 and/or the guides 134 can be removed instead, thereby leaving the domains 184, 164, with or without the guides 134.

Figure 13:
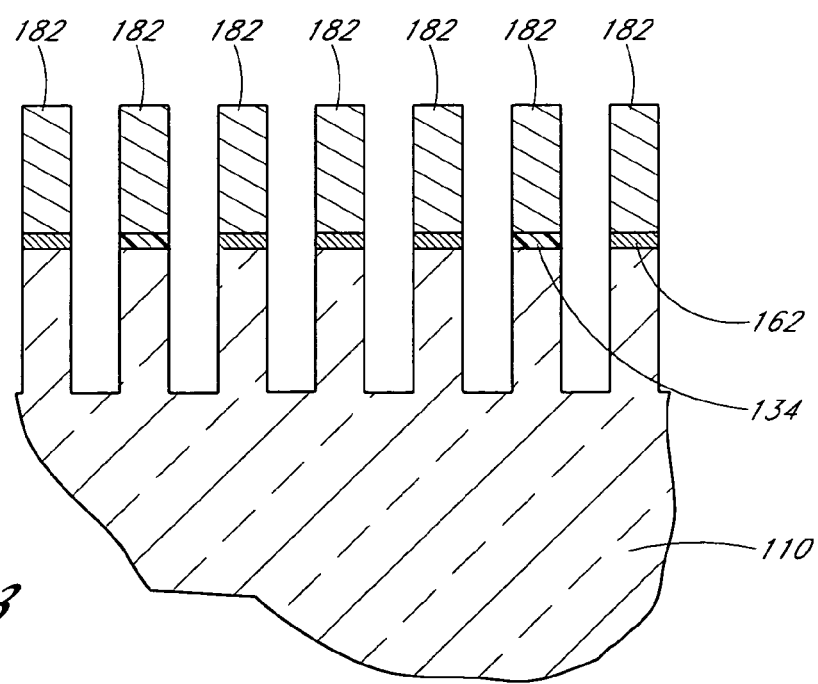
FIG. 13 is a schematic, cross-sectional side view of the partially formed integrated circuit of FIG. 12 after transferring the pattern defined by the block copolymers into the underlying substrate, in accordance with preferred embodiments of the invention.

With reference to FIG. 13, the domains 182, 162 and the guides 134 can be used as a mask for processing of the underlying substrate 110. For example, as illustrated, the substrate 110 can be etched through the mask using, e.g., an anisotropic etch that selectively etches the substrate relative to the domains 182 to transfer the pattern in the mask to the substrate 110. In one example, where the substrate 110 is formed of silicon, it can be selectively etched relative to the block domains 182 using a fluorine-based dry etch chemistry, e.g., such as that used to selectively remove silicon layers relative to photoresist. It will be appreciated that where the substrate 110 comprises layers of different materials, a succession of different chemistries, preferably dry-etch chemistries, can be used to successively etch through these different layers, if a single chemistry is not sufficient to etch all the different materials.

It will also be appreciated that, depending upon the chemistry or chemistries used, the domains 182, 162 and the guides 134 may be partially etched or worn during the transfer process. Advantageously, the domains 182 are sufficiently tall to allow etching or other processing of the substrate 110 to be completed before the domains 182 and/or 162 are completely etched away. Consequently, the tall domains 182 can facilitate etching of more difficult to etch substrates.

Figure 14:
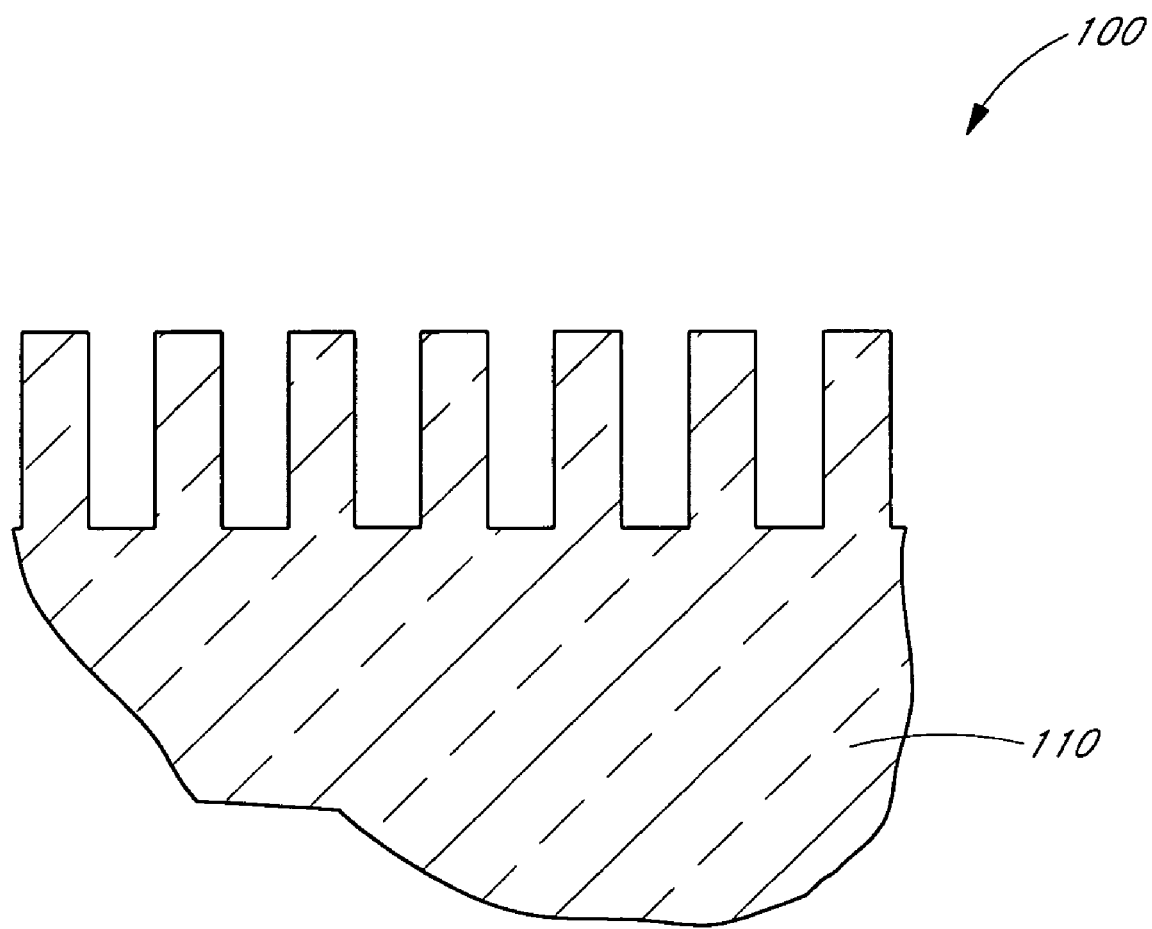
FIG. 14 is a schematic, cross-sectional side view of the partially formed integrated circuit of FIG. 13 after stripping the block copolymers, in accordance with preferred embodiments of the invention.
Figure 15:
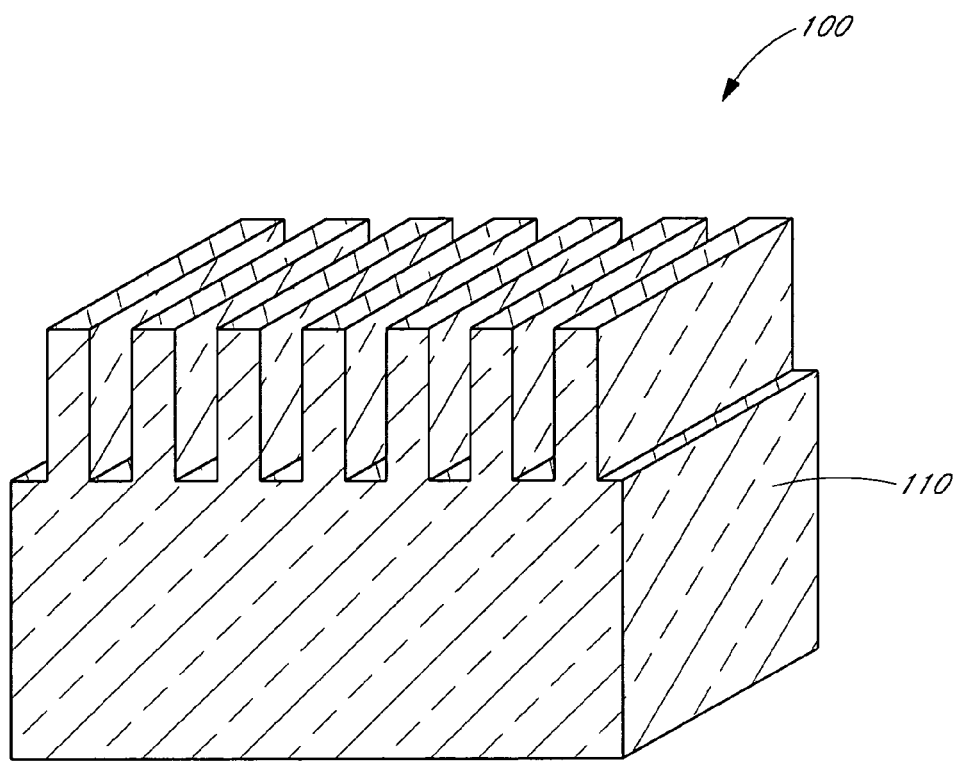
FIGS. 15 and 16 are schematic, perspective views of the partially formed integrated circuit of FIG. 14 showing exemplary patterns formed in the substrate, in accordance with preferred embodiments of the invention.
Figure 16:
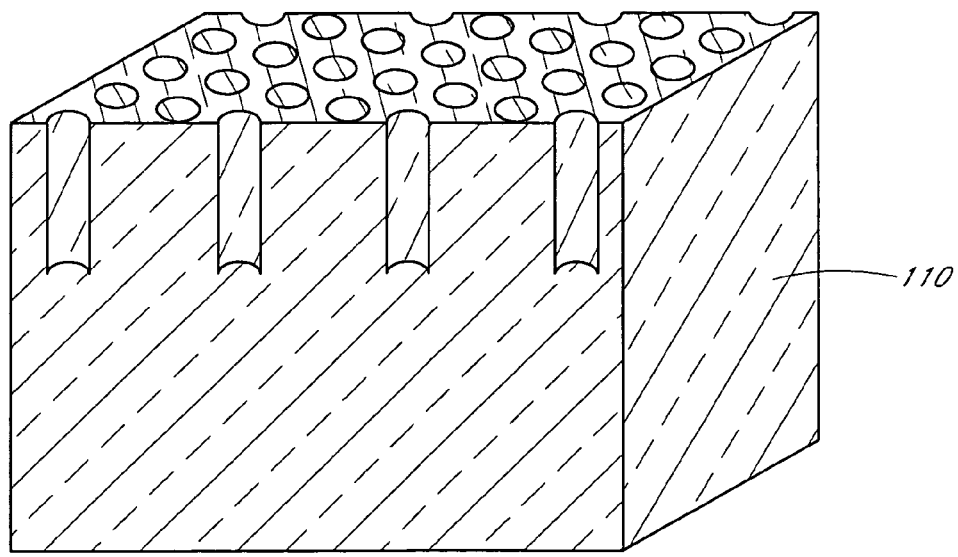

With reference to FIG. 14, the mask overlying the substrate 110, including the domains 182, 162 and the guides 134, are stripped, leaving the patterned substrate 110. With reference to FIGS. 15 and 16, the pattern formed in the substrate 110 can comprise, for example, lines (FIG. 15) or isolated pillar shapes, or conversely cylindrical holes (FIG. 16). The lines can form, e.g., interconnects for connecting electrical devices, preferably devices arranged in an array, such as the electrical devices which form memory cells in the array region of a memory device. In addition, the isolated pillar shapes can form electrical devices, which are preferably disposed in an array, such as capacitors for memory cells in a memory device. After the lines or isolated pillar shapes are formed, the partially fabricated integrated circuit 100 is subjected to subsequent processing steps, including forming ancillary electrical devices and electrical interconnects, to form a completed integrated circuit, e.g., a memory chip.

It will be appreciated that various modifications of the preferred embodiments are possible. For example, as noted above, the copolymer film 160 can be formed to a thickness below the height of the guides 134 (FIG. 6). In addition, the guides 134 can also be formed to have a height higher than the upper surface of the supplemental layer 180 (FIG. 11). In some embodiments, this may be advantageous for increasing process latitude by eliminating the need to provide supplemental copolymers which interact appropriately with the guides 134 to align with those guides 134.

Moreover, while discussed in the context of diblock copolymers, the copolymers can be formed of two or more block species. In addition, while the block species of the illustrated embodiment are each formed of a different monomer, the block species can share monomer(s). For example, the block species can be formed of different sets of monomers, some of which are the same, or can be formed of the same monomer, but in a different distribution in each block. Preferably, the different sets of monomers form blocks having different properties which can drive the self-organization of the copolymers.

In some embodiments, the hardmask and/or temporary layer overlying the substrate can be omitted. For example, the photodefinable material can be formed of or replaced by a material which is compatible with the temperatures and other conditions for copolymer self-organization and/or the copolymer blocks may be used as a mask for etching the substrate where an etch having sufficient selectivity for the substrate is available.

Also, while "processing" through a mask layer preferably involves etching an underlying layer, processing through the mask layers can involve subjecting layers underlying the mask layers to any semiconductor fabrication process. For example, processing can involve ion implantation, diffusion doping, depositing, oxidizing (particularly with use of a hard mask under the polymer mask), nitridizing, etc. through the mask layers and onto underlying layers. In addition, the mask layers can be used as a stop or barrier for chemical mechanical polishing (CMP) or CMP can be performed on any of the layers to allow for both planarization and etching of the underlying layers, as discussed in U.S. patent application Ser. No. 11/216,477, filed Aug. 31, 2005, the entire disclosure of which is incorporated by reference herein.

In addition, while illustrated applied to an exemplary sequence for fabricating integrated circuits, it will be appreciated that the preferred embodiments can be applied in various other applications when the formation of patterns with very small features is desired. For example, the preferred embodiments can be applied to form gratings, disk drives, storage media or templates or masks for other lithography techniques, including X-ray or imprint lithography. For example, phase shift photomasks can be formed by patterning a substrate which has a film stack having phase shifting material coatings.

It will be appreciated from the description herein that the invention includes various aspects. For example, according to one aspect of the invention, a method for forming a pattern over a semiconductor substrate is provided. The method comprises providing a template comprising a pattern defined by domains formed of like blocks of a block copolymer. A layer of self-organizing material is deposited on the template. The pattern is transferred to the layer of self-organizing material.

According to another aspect of the invention, a method for forming a mask pattern is provided. The method comprises depositing a layer of block copolymers. Blocks of the block copolymers are segregated to form domains comprising blocks of the block copolymers. The domains are subsequently vertically extended.

According to yet another aspect of the invention, method for forming a mask pattern is provided. The method comprises providing a substrate having an overlying block copolymer material disposed between guides for copolymer alignment. A first substantially regular pattern of block domains is provided between the guides for copolymer alignment. An additional block copolymer material is deposited over the first substantially regular pattern. A second substantially regular pattern of block domains is formed over the first substantially regular pattern.

According to another aspect of the invention, a partially fabricated integrated circuit is provided. The partially fabricated integrated circuit comprises a first plurality of regularly spaced copolymer block domains overlying a substrate. A second plurality of regularly spaced copolymer block domains is formed on the first plurality of copolymer block domains.

In addition to the above disclosure, it will also be appreciated by those skilled in the art that various omissions, additions and modifications may be made to the methods and structures described above without departing from the scope of the invention. All such modifications and changes are intended to fall within the scope of the invention, as defined by the appended claims.

We claim:

1. A method for forming a pattern over a semiconductor substrate, comprising:
   providing a template comprising a pattern defined by domains formed of like blocks of a block copolymer;
   depositing a layer of self-organizing material on the template; and
   transferring the pattern to the layer of self-organizing material.

2. The method of claim 1, wherein the self-organizing material comprises a plurality of chemical moieties, wherein transferring the pattern comprises aligning like chemical moieties of the self-organizing material with a domain of the template.

3. The method of claim 2, wherein the self-organizing material comprises additional block copolymers.

4. The method of claim 3, wherein aligning like chemical moieties of the self-organizing material comprises aggregating like blocks of the additional copolymers over particular domains of the template.

5. The method of claim 4, wherein the additional block copolymers are the same as the block copolymers forming the template.

6. A method for forming a pattern over a semiconductor substrate, comprising:
   providing a template comprising a pattern defined by domains formed of like blocks of a block copolymer;
   depositing a layer of self-organizing material on the template;
   transferring the pattern to the layer of self-organizing material; and
   selectively removing a block species forming the block copolymer and selectively removing a chemical moiety of the self-organizing material to form a mask pattern.

7. The method of claim 6, wherein selectively removing comprises performing a wet etch comprising acetic acid.

8. The method of claim 6, further comprising transferring the mask pattern into the semiconductor substrate.

9. The method of claim 1, wherein the block copolymers comprise diblock copolymers.

10. The method of claim 9, wherein the diblock copolymers comprise polystyrene.

11. The method of claim 10, wherein the diblock copolymers further comprise polymethylmethacrylate.

12. The method of claim 9, wherein the self-organizing material comprises block copolymers.

13. The method of claim 12, wherein the self-organizing material comprises diblock copolymers.

14. The method of claim 1, wherein the domains form a repeating pattern.

15. A method for forming a mask pattern, comprising:
   providing a substrate having an overlying block copolymer material disposed between guides for copolymer alignment;
   forming a first substantially regular pattern of block domains between the guides for copolymer alignment;
   depositing additional block copolymer material over the first substantially regular pattern; and
   forming a second substantially regular pattern of block domains over the first substantially regular pattern.

16. The method of claim 15 wherein block domains of the first and the second substantially regular patterns align.

17. The method of claim 16, wherein block domains of the first and the second substantially regular patterns comprise the same block species.

18. The method of claim 16, wherein the block copolymers and the additional block copolymers are diblock copolymers.

19. The method of claim 16, wherein the overlying block copolymer material has a thickness less than about a length scale of the overlying block polymers.

20. The method of claim 19, wherein depositing additional block copolymer material forms a layer of additional block copolymers having a thickness greater than about the length scale of the additional block polymers.

21. The method of claim 15, wherein forming the second substantially regular pattern comprises repairing defects in the first substantially regular pattern.

22. The method of claim 21, wherein repairing defects comprises forming the blocks domains of the second substantially regular pattern with top surfaces having a greater uniformity in height than top surfaces of the block domains of the first substantially regular pattern.

23. The method of claim 21, wherein repairing defects comprises forming the blocks domains of the second substantially regular pattern with a greater uniformity in critical dimensions than the block domains of the first substantially regular pattern.

24. The method of claim 15, wherein forming the first and the second substantially regular patterns comprises forming crosslinks between blocks forming the patterns.

25. The method of claim 15, wherein the overlying block copolymer material is disposed between and above the guides.

26. The method of claim 15, wherein the additional block copolymer material forms a layer having a thickness sufficient to form vertical lamellae within the layer.

27. The method of claim 15, wherein the layer has a thickness sufficient to form vertical cylinders within the layer.

28. The method of claim 15 wherein the block domains of the first and the second substantially regular pattern have a critical dimension of about 1 nm to about 100 nm.

29. The method of claim 28, wherein the critical dimension is about 2 nm to about 50 nm.

30. The method of claim 29, wherein the critical dimension is about 3 nm to about 30 nm.

31. The method of claim 16, wherein the guides comprise silicon.

32. A method for forming a mask pattern, comprising:
   providing a substrate having an overlying block copolymer material disposed between guides for copolymer alignment, wherein the guides comprise silicon oxide;
   forming a first substantially regular pattern of block domains between the guides for copolymer alignment;
   depositing additional block copolymer material over the first substantially regular pattern; and
   forming a second substantially regular pattern of block domains over the first substantially regular pattern, wherein block domains of the first and the second substantially regular patterns align.

* * * * *